(12) United States Patent
Nozawa et al.

(10) Patent No.: US 6,808,770 B2
(45) Date of Patent: Oct. 26, 2004

(54) HEAT-RESISTANT FILM AND THERMAL TRANSFER RECORDING MEDIUM

(75) Inventors: Takashi Nozawa, Kanuma (JP); Tetsuya Abe, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 10/054,730

(22) Filed: Jan. 22, 2002

(65) Prior Publication Data
US 2002/0150735 A1 Oct. 17, 2002

(30) Foreign Application Priority Data

Jan. 22, 2001 (JP) ........................................ 2001-012903

(51) Int. Cl.⁷ .............................................. B41M 5/40
(52) U.S. Cl. ................... 428/32.66; 428/32.68
(58) Field of Search ............................. 428/195, 488.4, 428/32.66, 32.68

(56) References Cited

FOREIGN PATENT DOCUMENTS

| EP | 0 547 893 A1 | 6/1993 | |
|---|---|---|---|
| EP | 0 634 291 A1 | 1/1995 | |
| JP | 63-268694 | 11/1988 | |
| JP | 1-49638 | 10/1989 | ............ B41M/5/26 |
| JP | 7-172076 | 7/1995 | |
| JP | 2521885 | 5/1996 | ............ B41M/5/40 |
| JP | 10-71773 | 3/1998 | ............ B41M/5/40 |

OTHER PUBLICATIONS

Patent Abstracts of Japan, Publication No. 07–172076; date of publication Jul. 11, 1995.
Patent Abstracts of Japan, Publication No. 57–129789; date of publication Aug. 11, 1982.
Patent Abstracts of Japan, publication No. 10–071773, publication dated Mar. 17, 1998.
Patent Abstracts of Japan; Publication No. 10071773, Published Mar. 17, 1998 (1 page).
Patent Abstracts of Japan; Publication No. 07172076, Published Jul. 11, 1995 (1 page).
Patent Abstracts of Japan; Publication No. 63268694, Published Nov. 7, 1988 (1 page).
European Search Report dated Nov. 7, 2002 (3 pages).

*Primary Examiner*—Bruce H. Hess
(74) *Attorney, Agent, or Firm*—Osha & May L.L.P.

(57) ABSTRACT

A heat-resistant film includes a film substrate and a heat-resistant slip layer. The heat-resistant slip layer is disposed on one surface of the film substrate and contains a binder and a slip additive, which is a higher fatty acid metal salt composition containing a free higher fatty acid in an amount of 3 to 30 wt % and a metal salt of a higher fatty acid. With this heat-resistant film, a good heat-resistivity and slipperiness are obtained even when the slip additive is contained in the heat-resistant slip layer in relatively small amounts. The slip additive improves the solution stability of the coating composition used to form the heat-resistant slip layer. Preferably, the free higher fatty acid is stearic acid and the metal salt of higher fatty acid is aluminum stearate.

13 Claims, 2 Drawing Sheets

<u>1A</u>

1

1A

HEAT-RESISTANT FILM AND THERMAL TRANSFER RECORDING MEDIUM

BACKGROUND OF THE INVENTION

1. Field of the Invention

The present invention relates to heat-resistant film suitable for use as thermal transfer recording medium such as thermal transfer ink ribbons.

2. Description of the Related Art

Ink ribbons for use with thermal dye-sublimation printers and thermal wax printers generally include a heat-resistant film, composed of film substrate, such as polyester film, and a heat-resistant slip layer disposed on one surface of the film substrate, and an ink layer disposed on the other surface of the film substrate. Heat-resistant slip layers are generally produced by dispersing a slip additive in a binder and shaping the binder into a film.

For example, one type of heat-resistant slip layer (1) is shown in Japanese Patent No. 2521885 in which a coating composition is used to form the film that serves as the heat-resistant slip layer. The coating composition contains a material, such as a polyethylene wax or a higher fatty acid amide, that acts as a slip additive or a parting agent when heat-melted in an amount of 10 to 100 parts by weight with respect to 100 parts by weight of a thermoplastic resin binder.

Another type of heat-resistant slip layer (2) shown in Japanese Patent Publication No. Hei 1-49638 uses a different coating composition to form the film that serves as the heat-resistant slip layer. This coating composition is obtained by blending a surfactant in a resin material having a softening point, or melting point, of 100° C. or higher to serve as the slip additive. The surfactant is solid or semi-solid at room temperature and has the hydrophilic-lipophilic balance (HLB) of 4 or higher.

Still another type of heat-resistant slip layer (3) proposed in Japanese Patent Laid-Open Publication No. Hei 10-71773 uses another coating composition to form the film that serve as the heat-resistant slip layer. The coating composition is composed of a slip additive, a thermal parting agent and a binder resin. The slip additive is a product produced by the reaction of isocyanate with a straight-chained aliphatic hydrocarbon that includes an amino, a carboxyl, or a mercapt group at one end. The thermal parting agent is a mixture of a metal salt of a higher fatty acid (e.g., calcium salt, magnesium salt, or lithium salt of stearic acid) and a surfactant containing a phosphoric acid ester.

The heat-resistant slip layer (1) disclosed in Japanese Patent No. 2521885 contains the material that acts as a slip additive or a parting agent and melts upon heating in a very large proportion (i.e., 10 to 100 parts by weight) relative to 100 parts by weight of the thermoplastic resin and, thus, the slip additive may bleed onto the surface. The heat-resistant slip layer (2) disclosed in Japanese Patent Publication No. Hei 1-49638 suffers a problem in that the slip additive tends to migrate to an ink layer while the heat-resistant slip layer (3) disclosed in Japanese Patent Laid-Open Publication No. Hei 10-25 71773 has a problem in that the metal salt of a higher fatty acid tends to precipitate or aggregate in the coating composition, reducing the solution stability of the coating composition. As a result, these slip layers may be unsuitable for certain applications.

The recent trend toward fast printing has led to a considerable increase in the amount of energy that a thermal printer head delivers to the heat-resistant slip layer. As a consequence, the heat-resistant film that includes a heat-resistant slip layer such as those described and indicated as (1), (2) and (3) above is more likely to suffer damage including peeling off of the heat-resistant slip layer or deformation due to thermal contraction of the film. Therefore, a need exists for novel heat-resistant film that can resist deterioration, while allowing high volume printing.

SUMMARY OF THE INVENTION

In a first aspect of the present invention, a heat-resistant film includes a film substrate and a heat-resistant slip layer disposed on one surface of the film substrate, where the heat-resistant slip layer comprises a binder and a slip additive, and wherein the slip additive is a higher fatty acid metal salt composition comprising a free higher fatty acid in an amount of 3 to 30 wt % and a metal salt of a higher fatty acid.

In a second aspect of the present invention, a heat-resistant film comprises a slip additive, wherein the free higher fatty acid in the slip additive is stearic acid and the metal salt of higher fatty acid is aluminum stearate.

In a third aspect of the present invention, the binder in the heat-resistant film comprises polymethylmethacrylate.

In a fourth aspect of the present invention a heat-resistant slip layer comprises the slip additive in an amount of 3 to 9 parts by weight with respect to 100 parts by weight of a binder.

In a fifth aspect of the present invention, a high glass transition temperature resin layer having a higher glass transition temperature than the binder of the heat-resistant slip layer is interposed between the film substrate and the heat-resistant slip layer.

DETAILED DESCRIPTION

Advantageously the present invention provides a heat-resistant film that includes a film substrate and a heat-resistant slip layer comprising a binder and a slip additive, wherein the heat-resistant slip layer exhibits an excellent heat-resistivity and slipperiness even when the amount of the slip additive is relatively small.

Also, the present invention improves the solution stability of a coating composition that is used to form the heat-resistant slip layer.

These and other advantages of the present invention will be readily apparent from the following description of the preferred embodiments of the invention, taken in conjunction with the accompanying drawings described below in which like elements have like numerals throughout the several views.

The present invention is described in detail below.

Figure 1:
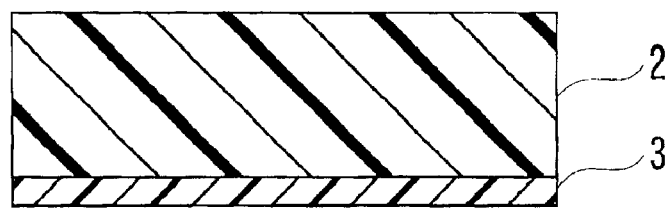
FIG. 1 shows a cross sectional view showing one exemplary construction of a heat-resistant film of the present invention.

FIG. 1 shows a cross sectional view of one exemplary construction of a heat-resistant film according to one embodiment of the present invention.

As shown in FIG. 1, the heat-resistant film 1 includes a film substrate 2 and a heat-resistant slip layer 3, which contains a binder and a slip additive and is disposed on one surface of the film substrate 2.

In the present invention, a higher fatty acid metal salt composition composed of a metal salt of a higher fatty acid and a free higher fatty acid serves as the slip additive.

Such a slip additive can impart a good heat-resistivity and slipperiness to the heat-resistant slip layer 3 even in relatively small amounts. In addition, it improves the solution stability of a coating composition that is used to form the heat-resistant slip layer 3.

The reason for this is believed to be as follows: when the higher fatty acid metal salt composition containing 3 to 30 wt % of a higher free fatty acid is dispersed in the binder, the free fatty acid, which is highly soluble in a typical solvent for the binder (e.g., methylethylketone (MEK) and toluene), helps the metal salt composition form fine particles and disperse in the coating composition, improving the solution stability of the coating composition. The coating composition that has an improved solution stability can improve the surface smoothness of the heat-resistant slip layer and thus can be used to improve the heat-resistivity and slipperiness of the heat-resistant slip layer 3.

In the present invention, the higher fatty acid metal salt composition for use as the slip additive contains a free higher fatty acid in an amount of 3 to 30 wt %, preferably 4 to 26 wt %, and a metal salt of a higher fatty acid composing the remainder of the higher fatty acid metal salt composition.

This is because the intended advantages of the present invention may not be achieved if the amount of the free higher fatty acid is less than 3 wt % and, conversely, if the amount exceeds 30 wt %, bleeding may result, which may lead to blocking.

Preferably, the particles of the higher fatty acid metal salt composition have the average size of 0.01 to 30 μm, more preferably 0.01 to 0.5 μm, since the average size that is too large can lead to a reduced surface smoothness while the average size that is too small may increase the cost to obtain such particles.

Examples of the free higher fatty acid include higher fatty acids having 12 to 18 carbon atoms such as lauric acid, parmitic acid and stearic acid.

Examples of the metal salt of higher fatty acid compound include compounds including alkaline metal salts, such as sodium and potassium salts, alkaline earth metal salts, such as calcium and magnesium salts, aluminum salts, and zinc salts of fatty acids having 12 to 18 carbon atoms, such as lauric acid, parmitic acid and stearic acid. Of these, aluminum salts that include one, two, or three higher fatty acid residues in one molecule of the compound and are thus capable of facilitating dispersion of the higher fatty acid metal salt composition are particularly preferred.

It should be noted that, while the higher fatty acid of the free higher fatty acid and that of the higher fatty acid metal salt composition may or may not be the same fatty acid in a fatty acid metal salt composition, it is preferred that they be the same fatty acid in order to make it possible to adjust the amount of the free higher fatty acid during production of the higher fatty acid metal salt composition. A combination of stearic acid and aluminum stearate is particularly preferred.

The binder for forming the heat-resistant slip layer 3 may be the same as those used in the heat-resistant slip layers of the conventional heat-resistant film. For example, the binder material may be polyester resins, polyvinyl acetate resins, polyether resins, styrene acrylate resins, polyurethane resins, polyolefin resins such as polyethylene and polypropylene, polystyrene resins, polyvinyl chloride resins, polyacrylic acid resins, resins based on esters of polyacrylic acid, polymethacrylic acid resins, resins based on esters of polymethacrylic acid, and polyvinyl butyral resins. Cross-linkages may be formed in these resins by adding a proper cross-linking agent, for example, an isocyanate cross-linking agent.

Of the binders, polymethylmethacrylate is preferably used since it can enhance the heat-resistivity and slipperiness of the higher fatty acid metal salt composition especially when the fatty acid metal salt composition contains stearic acid as the free higher fatty acid component and aluminum stearate as the metal salt of higher fatty acid.

The amount of the slip additive in the heat-resistant slip layer 3 is preferably from 3 to 9 parts by weight, more preferably from 7 to 9 parts by weight, with respect to 100 parts by weight of the binder since the desired effects may not be obtained if the amount is too small and blocking can result if the amount is too large.

The heat-resistant slip layer 3 typically has a thickness of 0.01 to 10.0 μm although the thickness may vary depending on the type of the binder and the slip additive or the type of the film substrate 2.

The film substrate 2 of the heat-resistant film 1 of the present invention may have the same construction as the film substrate of the conventional heat-resistant film. For example, the film substrate 2 may be polyester film, polyimide film, polyamide film, or the like. The film typically has a thickness of 1 to 50 μm.

Figure 2:
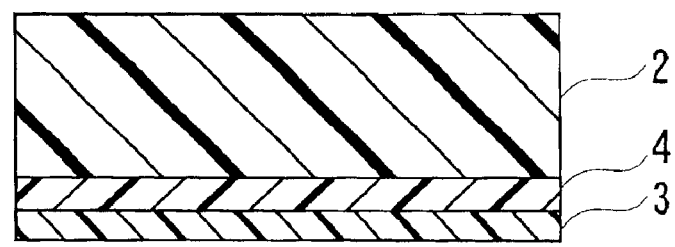
FIG. 2 shows a cross sectional view showing another construction of the heat-resistant film of the present invention.

As shown in FIG. 2, heat-resistivity has been further improved in a heat-resistant film 1A by interposing an heat-resistant intermediate layer 4 between a film substrate 2 and a heat-resistant slip layer 3.

In the present invention, the heat-resistant intermediate layer 4 may be formed as a high glass transition temperature resin layer that has a higher glass transition temperature than the binder component of the heat-resistant slip layer 3.

Examples of a suitable high glass transition temperature resin layer include a resin layer composed of a resin such as polyamide.

Alternatively, the heat-resistant intermediate layer 4 may be formed as a high heat-resistance resin layer by using a proper combination of a cross-linking resin and a cross-linking agent.

Examples of the cross-linking resin used to form the high heat-resistance resin layer include polyvinyl butyral, polyvinyl acetal and phenoxy resins while examples of the cross-linking agent include isocyanate and the like.

The heat-resistant film 1 of the present invention may be fabricated by uniformly mixing the binder with the slip additive in a solvent (e.g., toluene, MEK and butyl acetate) to form the coating composition for the heat-resistant slip layer and, in an ordinary manner, coating the coating composition onto the film substrate 2 and drying the coating.

When it is desired to provide the above-described high glass transition temperature resin layer, the heat-resistant film may be fabricated by, in an ordinary manner, applying the coating composition that contains the resin having a high glass transition temperature onto the film substrate 2 and drying the coating and subsequently applying the above-described coating composition for the heat-resistant slip layer and drying the coating in an ordinary manner.

Figure 3:
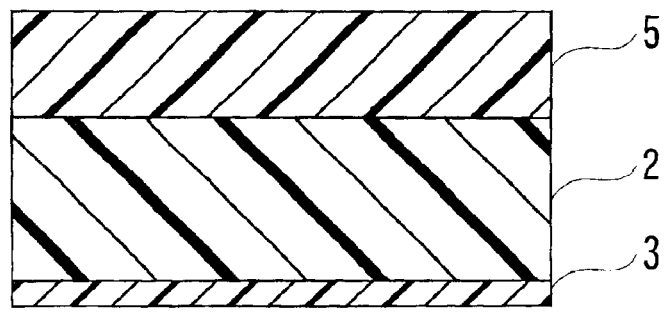
FIG. 3 shows a cross sectional view showing one exemplary construction of a thermal transfer recording medium of the present invention.
Figure 4:
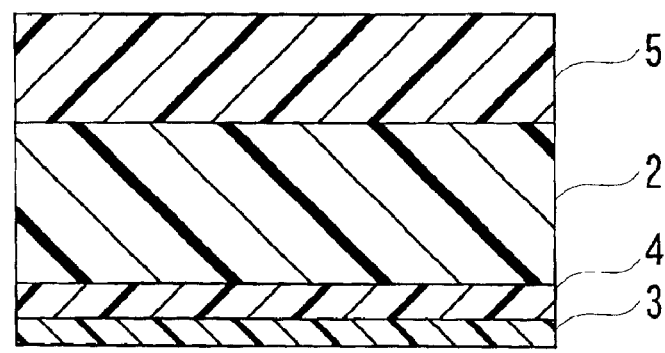
FIG. 4 shows a cross sectional view showing another construction of the thermal transfer recording medium of the present invention.

While the heat-resistive and slip characteristics of the heat-resistant film 1 of the present invention make it ideal for various applications such as protection of circuit boards and protection of electrical cords and tubes in an engine compartment of automobiles, it is particularly suitable for use in thermal transfer recording media 10 and 10A, which, as shown in FIGS. 3 and 4, include a thermal transfer ink layer 5 of dye-sublimation type or thermal wax type disposed on the surface of a film substrate 2 opposite to a heat-resistant slip layer 3.

The thermal transfer ink layer 5 may be of the same construction as those used in the conventional thermal transfer recording media: it may be a dye-sublimation thermal transfer ink layer that is a film layer formed of an ink composition composed of a heat-resistant binder and color materials having the ability to sublimate or diffuse upon application of heat and having been dispersed in the binder with a solvent, or it may be a thermal wax ink layer that is a film layer formed of an ink composition composed of a material with an ability to melt upon application of heat and color materials dispersed in the material with a solvent.

Examples of the color materials that are used in the dye-sublimation thermal transfer ink layer and have the ability to sublimate or diffuse upon application of heat include various nonionic colorants such as azo-, anthraquinone-, styryl-, naphthoquinone-, quinophthalone-, azomethine-, coumarin-, and condensation polycyclic compound-based dyes.

Examples of the heat-resistant binder include polycarbonate resins, polysulfone resins, polyvinyl butyral resins, phenoxy resins, polyarylate resins, polyamide resins, polyaramide resins, polyimide resins, polyetherimide resins, polyester resins, acrylonitrile-styrene resins, and cellulose resins such as acetylcellulose, methylcellulose and ethylcellulose.

Examples of the solvent include aromatic solvents such as toluene and xylene; ketone solvents such as methylethylketone, methylisobutylketone and cyclohexanone; ester solvents such as ethyl acetate and butyl acetate; alcohol solvents such as isopropanol, butanol and methyl cellosolve; ether solvents such as dioxane and tetrahydrofuran; and amide solvents such as dimethylformamide cyclohexanone and N-methylpyrrolidone.

Examples of the color materials for use in the thermal wax ink layer include inorganic pigments such as carbon black; organic pigments such as those based on azo-compounds and condensation polycyclic compounds; and colorants such as acidic dyes, basic dyes, oil-soluble dyes and metal complex salt dyes.

The material with the ability to melt upon application of heat is preferably a solid or semi-solid material with the melting point of 40 to 120° C. Examples of such material include paraffin wax, microcrystalline wax, carnauba wax, montan wax, Japan wax and synthetic wax based on oils and fats.

The solvent may be the same as those used in the dye-sublimation thermal transfer ink layer.

The above-described ink compositions may optionally contain various additives including non-sublimating particles, a dispersing agent, an antistatic agent, an anti-blocking agent, an anti-foaming agent, an antioxidant agent, a viscosity modifier, a pH conditioner and a lubricant. These additives may be either organic or inorganic. The ink composition may be applied in the same manner as the heat-resistant slip layer 3 to a typical dry coating thickness of 0.1 to 5 μm.

EXAMPLES

The present invention will now be described more specifically by means of Examples.

Higher fatty acid metal salt compositions each containing a different metal salt of higher fatty acid (stearic acid), manufactured by SAKAI CHEMICAL INDUSTRY Co., Ltd., were used in Examples and Comparative Examples and are listed in Table 1 below. A product RD-720, manufactured by SAKAI CHEMICAL

TABLE 1

| Kinds of metal salts of stearic acid | Trade name | Molecular weight | Amount of free fatty acid (weight %) |
|---|---|---|---|
| Aluminum (AL) salt | SA-1000 | 345 | 10.0≧ |
| Aluminum (AL) salt | SA-2000 | 878 | 22.0 ± 4.0 |
| Lithium (Li) salt | S-7000 | 290 | 1.0≧ |
| Magnesium (Mg) salt | SM-1000 | 591 | 2.0≧ |
| Calcium (Ca) salt | SC-100 | 607 | 0.5≧ |
| Barium (Ba) salt | SB | 706 | 0.5≧ |
| Zinc (Zn) salt | SZ-2000 | 632 | 1.0≧ |

INDUSTRY Co., Ltd., was used as a phosphoric ester sodium salt.

Examples 1–2, and Comparative Examples 1–7

9 parts by weight of each of slip additives shown in Table 2 and toluene to serve as a solvent were uniformly mixed with 1000 parts by weight of polymethylmethacrylate (M-2000, solid component 10 wt %, manufactured by Soken Chemical and Engineering Co., Ltd.) to prepare coating compositions for the heat-resistant slip layer each containing 10 wt % solid component. The resulting compositions were tested for the solution stability and the results were rated as described in the following. The ratings were shown in Table 2 below.

Solution Stability

Coating solutions of the slip additives were prepared and left to stand for 24 hours. The solutions were then observed for the presence of precipitates. A circle indicates that precipitates were formed for the solution. A cross indicates no precipitate formation.

Next, sample pieces were prepared in the following manner: a mixture of polyvinyl acetal (KS-1, manufactured by Sekisui Chemical Co., Ltd., glass transition temperature: 120° C.) and an isocyanate cross-linking agent (D-103, manufactured by Takeda Chemical Industries, Ltd.), containing the two components in an equivalent ratio of 1:1.2, was applied onto one surface of pieces of 6 μm thick polyester film to form a 0.9 μm thick layer of a cross-linking resin. Using a coil bar coater, each of the coating compositions was then coated onto each piece of the polyester film on top of the cross-linking resin layer to form a layer with a dry thickness of 0.7 μm.

The coated film pieces were then dried in a dry furnace at 100° C. for one minute to finish the heat-resistant slip layer and thus obtain the heat-resistant film.

Subsequently, the pieces of the heat-resistant film were aged for 48 hours at 50° C. to allow cross-linkages to form in the cross-linking resin layer in order to impart heat-resistivity to the layer. This completed the sample pieces of the heat-resistant film.

In the manner described below, the sample pieces of the heat-resistant film were tested and rated for the anti-film damage property and the anti-coat peel property, each of which provides a good measure for the heat-resistivity of the heat-resistant film. The results are shown in Table 2.

A phosphoric ester sodium salt was used in place of the stearic acid metal salt composition in Comparative Example 6. The heat-resistant slip layer was not formed on the sample piece of Comparative Example 7 and the resin layer with high glass transition temperature was left exposed.

Anti-Film Damage Property

Using a thermal transfer printer (Data Card III, Masstransfer Mode, printing energy level: 10750), solid black patterns were printed on the sample pieces of the heat-resistant film, and the sample pieces were observed for the presence of any distortion in shape. The samples were rated as follows: a circle indicates no deformation; a triangle indicates the presence of deformation; and a cross indicates that the film was torn apart.

Anti-Coat Peel Property

A strip of commercially available adhesive tape (sold under the name "Cellotape" by Nichiban Co., Ltd.) was applied to the samples of the heat-resistant film on the heat-resistant slip layer and was then peeled to see if the heat-resistant slip layer peeled with the tape. The samples were rated as follows: a circle indicates the heat-resistant slip layer did not peel; and a cross indicates that the layer peeled.

TABLE 2

| | Kinds of metal salts of stearic acid | Solution stability | Anti-film damage property | Anti-coat peel property |
|---|---|---|---|---|
| Example | | | | |
| 1 | AL salt (SA-1000) | ○ | ○ | ○ |
| 2 | AL salt (SA-2000) | ○ | ○ | ○ |
| Comparative Example | | | | |
| 1 | Li salt (S-7000) | x | Δ | ○ |
| 2 | Mg salt (SM-1000) | x | (Unable to coat) | |
| 3 | Ca salt (SC-100) | x | (Unable to coat) | |
| 4 | Ba salt (SB) | x | Δ~x | ○ |
| 5 | Zn salt (SZ-2000) | ○ | Δ~x | ○ |
| 6 | Phosphoric ester sodium salt | ○ | Δ~x | ○ |
| 7 | No heat-resistant slip layer | ○ | (Unable to run) | |

As can be seen from Table 2, Examples 1 and 2, in which the higher fatty acid metal salt compositions composed of 3 to 30 wt % of free higher fatty acid (stearic acid) and a metal salt of higher fatty acid (aluminum stearate) were used to serve as the slip additive, showed a good solution stability of the coating compositions of the heat-resistant slip layer. Examples 1 and 2 also showed good anti-film damage property and anti-coat peel property.

In contrast, among Comparative Examples 1 through 5, in which the higher fatty acid metal salt compositions containing less than 3 wt % of free higher fatty acid were used as the slip additive, Comparative Examples 1 through 3 showed insufficient solution stability while Comparative Examples 4 and 5 showed insufficient anti-film damage property.

Comparative Example 6, in which the phosphoric ester sodium salt was used in place of the stearic acid metal salt composition to serve as the slip additive, exhibited insufficient anti-film damage property. In Comparative Example 7, in which the heat-resistant slip layer was not formed and the resin layer with high glass transition temperature was left exposed, the heat-resistant film did not run properly on the printer.

The heat-resistant film of the present invention, in which the heat-resistant slip layer composed of the binder and the slip additive is disposed on one surface of the film substrate, employs a higher fatty acid metal salt composition composed of 3 to 30 wt % of free higher fatty acid and a metal salt of a higher fatty acid as the slip additive and thus exhibits a good heat-resistivity and slipperiness even when the slip additive is contained in the heat-resistant slip layer in relatively small amounts. In addition, the slip additive improves the solution stability of the coating composition for forming the heat-resistant slip layer.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A heat-resistant film comprising a film substrate and a heat-resistant slip layer disposed on one surface of the film substrate, the heat-resistant slip layer comprising a binder and a slip additive, wherein the slip additive is a higher fatty acid metal salt composition comprising a free higher fatty acid in an amount of 3 to 30 wt % and a metal salt of a higher fatty acid, and wherein the binder is polymethylmethacrylate.

2. The heat-resistant film according to claim 1, wherein the heat-resistant slip layer comprises the slip additive in an amount of 3 to 9 parts by weight with respect to 100 parts by weight of the binder.

3. The heat-resistant film according to claim 2, wherein a high glass transition temperature resin layer having a higher glass transition temperature than the binder of the heat-resistant slip layer is interposed between the film substrate and the heat-resistant slip layer.

4. The heat-resistant film according to claim 1, wherein a high glass transition temperature resin layer having a higher glass transition temperature than the binder of the heat-resistant slip layer is interposed between the film substrate and the heat-resistant slip layer.

5. The heat-resistant film according to claim 1, wherein the free higher fatty acid is stearic acid and the metal salt of higher fatty acid is aluminum stearate.

6. The heat-resistant film according to claim 5, wherein the heat-resistant slip layer comprises the slip additive in an amount of 3 to 9 parts by weight with respect to 100 parts by weight of the binder.

7. The heat-resistant film according to claim 5, wherein a high glass transition temperature resin layer having a higher glass transition temperature than the binder of the heat-resistant slip layer is interposed between the film substrate and the heat-resistant slip layer.

8. A heat-resistant film comprising a film substrate and a heat-resistant slip layer disposed on one surface of the film substrate, the heat-resistant slip layer comprising a binder and a slip additive, wherein the slip additive is a higher fatty acid metal salt composition comprising a free higher fatty acid in an amount of 3 to 30 wt % and a metal salt of a higher fatty acid, and wherein a high glass transition temperature resin layer having a higher glass transition temperature than the binder of the heat-resistant slip layer is interposed between the film substrate and the heat-resistant slip layer.

9. The heat-resistant film according to claim 8, wherein the heat-resistant slip layer comprises the slip additive in an amount of 3 to 9 parts by weight with respect to 100 parts by weight of the binder.

10. The heat-resistant film according to claim 8, wherein the free higher fatty acid is stearic acid and the metal salt of higher fatty acid is aluminum stearate.

11. The heat-resistant film according to claim 10, wherein the heat-resistant slip layer comprises the slip additive in an amount of 3 to 9 parts by weight with respect to 100 parts by weight of the binder.

12. A thermal transfer recording medium including a film substrate and a thermal transfer ink layer disposed on one surface of the film substrate and a heat-resistant slip layer disposed on the other surface of the film substrate, the heat-resistant slip layer comprising a binder and a slip additive, wherein the slip additive is a higher fatty acid metal salt composition comprising a free higher fatty acid in an amount of 3 to 30 wt % and a metal salt of a higher fatty acid, and wherein the binder is polymethylmethacrylate.

13. A thermal transfer recording medium including a film substrate and a thermal transfer ink layer disposed on one surface of the film substrate and a heat-resistant slip layer disposed on the other surface of the film substrate, the heat-resistant slip layer comprising a binder and a slip additive, wherein the slip additive is a higher fatty acid metal salt composition comprising a free higher fatty acid in an amount of 3 to 30 wt % and a metal salt of a higher fatty acid, and wherein a high glass transition temperature resin layer having a higher glass transition temperature than the binder of the heat-resistant slip layer is interposed between the film substrate and the heat-resistant slip layer.

\* \* \* \* \*

UNITED STATES PATENT AND TRADEMARK OFFICE
CERTIFICATE OF CORRECTION

PATENT NO. : 6,808,770 B2
DATED : October 26, 2004
INVENTOR(S) : Takashi Nozawa et al.

It is certified that error appears in the above-identified patent and that said Letters Patent is hereby corrected as shown below:

Column 6,
Line 46, please insert -- no -- in front of "precipitates";
please replace the phrase "precipitates were" with -- precipitate was --.
Line 47, please replace the word "no" with -- that --;
please replace the phrase "precipitate formation" with -- precipitates were formed --.

Signed and Sealed this

Tenth Day of May, 2005

JON W. DUDAS
*Director of the United States Patent and Trademark Office*